US011303089B2

(12) United States Patent
Schmidt

(10) Patent No.: US 11,303,089 B2
(45) Date of Patent: Apr. 12, 2022

(54) PHYSICALLY OPERABLE AND MECHANICALLY RECONFIGURABLE LIGHT SOURCES

(71) Applicant: The Regents of the University of California, Oakland, CA (US)

(72) Inventor: Holger Schmidt, Capitola, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 29 days.

(21) Appl. No.: 16/486,774

(22) PCT Filed: Feb. 19, 2018

(86) PCT No.: PCT/US2018/018646
§ 371 (c)(1),
(2) Date: Aug. 16, 2019

(87) PCT Pub. No.: WO2018/152478
PCT Pub. Date: Aug. 23, 2018

(65) Prior Publication Data
US 2021/0143605 A1 May 13, 2021

Related U.S. Application Data

(60) Provisional application No. 62/461,164, filed on Feb. 20, 2017.

(51) Int. Cl.
*H01S 3/102* (2006.01)
*H01S 3/063* (2006.01)
(Continued)

(52) U.S. Cl.
CPC ............ *H01S 3/0635* (2013.01); *H01S 3/022* (2013.01); *H01S 3/0637* (2013.01); *H01S 3/083* (2013.01);
(Continued)

(58) Field of Classification Search
CPC .... H01S 3/022; H01S 3/094034; H01S 3/168; H01S 3/20–213; H01S 3/2358;
(Continued)

(56) References Cited

U.S. PATENT DOCUMENTS 4,002,998 A   1/1977  Conwell et al.
6,020,207 A   2/2000  Liu
(Continued)

FOREIGN PATENT DOCUMENTS

EP      0414430 A1    2/1991
JP    H07-027927 A    1/1995
(Continued)

OTHER PUBLICATIONS

Song et al. ("Pneumatically tunable optofluidic dye laser", Applied physics letters, 06, 081101, 2010) (Year: 2010).*
(Continued)

*Primary Examiner* — Tod T Van Roy
(74) *Attorney, Agent, or Firm* — Carter, DeLuca & Farrell LLP

(57) ABSTRACT

A combination of microvalves and waveguides may enable the creation of reconfigurable on-chip light sources compatible with planar sample preparation and particle sensing architecture using either single-mode or multi-mode interference (MMI) waveguides. A first type of light source is a DFB laser source with lateral gratings created by the light valves. Moreover, feedback for creating a narrowband light source does not have to be a DFB grating in the active region. A DBR configuration (Bragg mirrors on one or both ends of the active region) or simple mirrors at the end of the cavity can also be used. Alternately, ring resonators may be created using a valve coupled to a bus waveguide where the active gain medium is either incorporated in the ring or inside an enclosed fluid. The active light source may be
(Continued)

activated by moving a fluid trap and/or a solid-core optical component defining its active region.

39 Claims, 4 Drawing Sheets

(51) Int. Cl.
| | |
|---|---|
| *H01S 3/02* | (2006.01) |
| *H01S 3/083* | (2006.01) |
| *H01S 3/0915* | (2006.01) |
| *H01S 3/213* | (2006.01) |
| *H01S 3/105* | (2006.01) |
| *H01S 5/12* | (2021.01) |
| *H01S 3/106* | (2006.01) |
| *H01S 3/1055* | (2006.01) |
| *H01S 5/34* | (2006.01) |

(52) U.S. Cl.
CPC ............ *H01S 3/0915* (2013.01); *H01S 3/102* (2013.01); *H01S 3/1053* (2013.01); *H01S 3/1067* (2013.01); *H01S 3/213* (2013.01); *H01S 5/1234* (2013.01); *H01S 3/1026* (2013.01); *H01S 3/1055* (2013.01); *H01S 5/3412* (2013.01)

(58) Field of Classification Search
CPC .... H01S 3/1026; H01S 3/1067; H01S 3/0632; H01S 3/0635; H01S 3/0637; H01S 5/0607; H01S 5/1234; H01S 5/3412
See application file for complete search history.

(56) References Cited

U.S. PATENT DOCUMENTS

| | | | | |
|---|---|---|---|---|
| 6,141,367 | A * | 10/2000 | Fan | H01S 3/10 372/53 |
| 6,899,849 | B2 * | 5/2005 | Meinhart | G01N 21/05 250/200 |
| 7,343,074 | B1 | 3/2008 | Gallagher et al. | |
| 8,792,523 | B1 * | 7/2014 | Kim | H01L 29/84 372/20 |
| 2009/0032730 | A1 | 2/2009 | Erickson et al. | |
| 2010/0172610 | A1 * | 7/2010 | Gates | G02B 6/12007 385/14 |

FOREIGN PATENT DOCUMENTS

| | | |
|---|---|---|
| JP | 2004-529349 A | 9/2004 |
| JP | 2005-141009 A | 6/2005 |
| JP | 2008-536129 A | 9/2008 |
| JP | 2010-519557 A | 6/2010 |
| JP | 2013-088367 A | 5/2013 |
| JP | 2016-503489 A | 2/2016 |
| WO | WO 2002/088686 A1 | 11/2002 |
| WO | WO 2006/110749 A2 | 10/2006 |
| WO | WO 2014/062719 A2 | 4/2014 |
| WO | WO 2016/038015 A1 | 3/2016 |
| WO | WO 2016/038108 A1 | 3/2016 |
| WO | PCT/US2016/049999 | 3/2017 |

OTHER PUBLICATIONS

Parks et al. ("Flexible optofluidic waveguide platform with multi-dimensional reconfigurability", Nature—Scientific reports, 6:33008, DOI:10.1038/srep33008, Sep. 6, 2016) (Year: 2016).*
Tang et al. ("A multi-color fast switching microfluidic droplet dye laser", Lab chip, 2009, 9, 2767-2771) (Year: 2009).*
Li ("Optofluidic dye lasers", Ph.D. dissertation, CalTech, deposited on Oct. 4, 2007) (Year: 2007).*
Wang et al. ("Optofluidic laser array based on stable high-Q faby-perot microcavities", Lab chip, 2015, 15, 2862-3869) (Year: 2015).*
Risk et al.; "Optical waveguides with an aqueous core and a low-index nanoporous cladding"; Optics Express; vol. 12; Dec. 2004; p. 6446-6455.
Chen et al.; "A Multi-D-Shaped Optical Fiber for Refractive Index Sensing"; Sensors; vol. 10; 2010; p. 4794-4804.
Yin et al.; "Integrated optical waveguides with liquid cores"; Applied Physics Letters; vol. 85; Oct. 2004; p. 3477-3479.
Li et al.; "Optofluidic Distributed Feedback Dye Lasers"; IEEE Journal of Selected Topics in Quantum Electronics; vol. 13 No. 2; 2007; p. 185-193.
Psaltis et al.; "Tuning Mechanisms in Optofluidics"; Conf. on Lasers and Electro-Optics (CLEO) and Quantum Electronics and Laser Science Conf.; 2010; 2 pages.
International Patent Application No. PCT/US2018/018646; Int'l Search Report and the Written Opinion; dated May 9, 2018; 14 pages.

* cited by examiner

PHYSICALLY OPERABLE AND MECHANICALLY RECONFIGURABLE LIGHT SOURCES

CROSS REFERENCE TO RELATED APPLICATIONS

This application is the U.S. National Stage of International Application No. PCT/US2018/018646, filed Feb. 19, 2018, titled "PHYSICALLY OPERABLE AND MECHANICALLY RECONFIGURABLE LIGHT SOURCES," which claims priority to U.S. provisional patent application No. 62/461,164, titled "MECHANICALLY RECONFIGURABLE OPTOFLUIDIC LIGHT SOURCES," filed Feb. 20, 2017, which is hereby incorporated by reference in its entirety. International Application No. PCT/US2016/049999, filed Sep. 1, 2016, titled "Reconfigurable Microvalve Optical Waveguide," is also hereby incorporated by reference in its entirety.

TECHNICAL FIELD

The present disclosure relates generally to light sources, and more particularly to mechanically reconfigurable light sources including mechanically reconfigurable optofluidic light sources.

BACKGROUND

The dynamic adjustment of optical device properties was an early focus of optofluidics. By using gases or liquids as functional elements of a device, tuning or reconfiguration can be achieved in one or both of two ways: by replacing the fluid itself, and by altering the physical dimensions of the device. The latter may be possible, for example, when a soft material such as PDMS is used to enclose the fluids of the device. Examples for fluidically-tunable photonic elements include switches, photonic crystals, ring resonators, interference devices, spectral filters, and optofluidic lenses. Furthermore, certain reconfigurable on-chip light sources are known.

For example, a micro-cavity-based fluidic dye laser was one of the earliest demonstrated devices, featuring rhodamine 6G as organic gain medium enclosed in an SU-8/glass microchannel structure. This represented a dramatic miniaturization of classic organic dye laser with the benefit of being able to replace the gain medium quickly and easily. A second landmark demonstration was the dynamic tuning of the laser emission wavelength by using mechanical deformation of a soft microfluidic chip. Tuning of the emission wavelength of a PDMS distributed feedback (DFB) laser over 30 nm by changing the grating length was demonstrated. Other cavity configurations have been demonstrated, for example using optofluidic ring resonators.

More recently, research in optofluidic light sources has shifted towards new, biologically inspired gain media. These include luciferin, a light-emitting molecule produced by many organisms, vitamin B2 doped gelatin films, DNA Holliday junctions, green fluorescent proteins within a single cell, and even blood. Incoherent light sources have also been demonstrated, for example using dyes in liquid-liquid waveguides. They generate large enough optical power for on-chip fluorescence detection, especially if only a small number of targets need to be excited.

Furthermore, International Application No. PCT/US2016/049999, filed Sep. 1, 2016, titled "Reconfigurable Microvalve Optical Waveguide," mentioned above, describes an optical waveguide comprising multiple layers of solid-state material disposed on a substrate, whereby one of the layers is a lifting-gate valve made of a high refractive index material.

The principle of reconfigurable waveguide technology that combines microfluidic microvalves and a PDMS waveguide platform was introduced in "Flexible optofluidic waveguide platform with multidimensional reconfigurability," by Parks and Schmidt, published in Scientific Reports in 2016, and hereby incorporated by reference in its entirety.

FIGS. 1A and 1B illustrate a waveguide 100 of the type described in "Flexible optofluidic waveguide platform with multidimensional reconfigurability;" this kind of waveguide may be referred to as a "lightvalve." As used herein, the term "lightvalve" may refer to any waveguide device in which an optical element of the waveguide device, such as a high-refractive-index element, is mechanically and/or physically movable and/or deformable, such as to selectively move an optical element into or out of an optical path and/or to selectively allow fluid to flow into a space opened or blocked by the moving optical element. FIG. 1A shows waveguide 100 in a closed position and FIG. 1B shows waveguide 100 in an open position. As shown, waveguide 100 may comprise first layer 102 and second layer 104, which may define open space 108 for air or other gas between them. Waveguide 100 may further comprise third layer 106, which may define channel 110 in the space between it and second layer 104. Open space 108 may be able to be positively or negatively pressurized with air or other gas to cause second layer 104 to deform upwards or downwards due to the pressure. Valve seat 112 may be disposed on middle layer 104 inside channel 110, and may be configured to selectively seal channel 110 such that fluid may or may not flow through channel 110. As shown in FIG. 1A, when space 108 is not pressurized, valve seat 112 may seal channel 110 such that fluid may not flow through it; as shown in FIG. 1B, when space 108 is negatively pressurized, valve seat 112 may be lifted up such that it does not seal channel 110 and such that fluid may flow through channel 110. The architecture and fabrication of waveguide 100 may be the same or similar to an lifting-gate microvalve, except that valve seat 112 is made from a high refractive index PDMS layer. Thus, deforming second layer 104 may cause valve seat 112 to move in and out of the path of mode 114, thus mechanically adjusting the optical properties of waveguide 100 while allowing light to be confined to the channel layer as shown. This approach has three benefits:

First, it creates a movable optical waveguide that can be lifted or compressed pneumatically to control the flow of light. FIG. 1B shows how light is directed into (lossy) air or liquid when the lightvalve is lifted. In this way, the path of light in the photonic device may be mechanically controlled.

Second, a lightvalve can be fabricated independently from any solid-core PDMS waveguides defined in first layer 102. This means that two different waveguide types can be placed in the same plane. FIG. 1C shows a photograph of a fabricated lightvalve 116, showing how two PDMS waveguides may be aligned and optically connected. FIG. 1D shows graph 118, which shows the relationship of transmission (dB) to pressure (PSI), demonstrating how lightvalve 116 acts as an optical switch, providing fine control of the transmitted power across its length depending on the pneumatic pressure, and showing large on-off ratios with over 45 dB suppression. It should be noted that lightvalves can be operated over thousands of cycles without degradation.

Third, a lightvalve can be structurally similar or identical to lifting-gate valves, thus allowing for fabrication of on-chip light sources and sample processing sections in one step.

Rather than using a simple drop-in element for a lightvalve waveguide device (such as valve seat 112 shown above in FIGS. 1A and 1B), a lighvalve-style optofluidic device may also include a valve seat having complex (e.g., non-planar) geometries that can be tailored to specific optical and fluidic functions.

For example, FIG. 2A shows the example of an optofluidic fluid trap 200 in which valve seat 202 is shaped in the form of a ring with two connecting straight waveguide sections. Fluid trap 200 may function as a lightvalve in a similar manner as described above with respect to waveguide 100. That is, valve seat 202 may be physically moved up and down (in the direction in and out of the plane of the illustration of FIG. 2A), in order to be moved in and out of flow path of channel 204, by which fluid may flow from the top of the illustration toward the bottom. By moving valve seat 202 up and down into the path of flowing fluid in channel 204, a well-defined fluid volume is enclosed by the ring formed by seat 202. Moving valve seat 202 up and down may also move it in and out light path 206

FIG. 2B shows two photographs of fabricated trap 208, which is similar to the illustrated trap 200. The bottom photograph in FIG. 2B shows how a well-confined light beam can traverse the central region of a ring-shaped valve seat, such as valve seat 202, when it is filled with liquid and the valve is lowered. By repeated actuation (lifting and lowering) of a ring-shaped valve seat, it has been shown that single particles such as *E. coli* bacteria can be trapped inside a fluid-filled ring-shaped valve seat for optical analysis.

FIG. 2C shows graph 210 shows three autocorrelation curves created by trapping different respective numbers of fluorescent beads in a central trapping region of an optical trap such as trap 208 and/or trap 200, and by exciting the particles as shown in FIG. 2B (bottom) and collecting fluorescence output along a solid-core waveguide. In FIG. 2C, the uppermost curve at the left side of graph 210 corresponds to the trapped particles shown in still frame 212; the middle curve at the left side of graph 210 corresponds to the trapped particles shown in still frame 214; and the lowermost curve at the left side of graph 210 corresponds to the trapped particles shown in still frame 216.

SUMMARY

As described above, various optofluidic devices using gases or liquids as functional optical elements of the device are known, including lightvalves in which a high-refractive-index PDMS valve seat may be selectively moved in and out of a light path to adjust optical properties of the device.

The present disclosure introduces a new approach to building reconfigurable light sources in which a flexible layer is used to move and/or deform one or more optical elements in order to reconfigure an on-chip light-source, such as a laser. By using a flexible layer to deform and/or reposition a solid-core or liquid-core optical element, lightsources such as lasers may be activated, deactivated, and/or tuned. In some embodiments, a hollow fluid trap defining a laser cavity may be selectably lifted out of and lowered into a liquid that may serve as a gain medium for the laser, such that the laser may be turned on and off by lifting and lowering the trap. In some embodiments, a solid optical component with a gain medium permanently incorporated into the element itself may serve as a cavity for a laser, and be may be selectably lifted, lowered, and/or deformed in order to turn the laser on and off and/or to tune the laser.

In some embodiments, a combination of PDMS-based microvalves and waveguides enables the creation of novel and reconfigurable on-chip light sources that may be compatible with established planar particle sensing architecture using either single-mode or multi-mode interference (MMI) waveguides. A first type of light source is a distributed feedback (DFB) laser source with lateral gratings created by light valves. Alternately or additionally to a DFB grating, feedback for creating a laser source may be generated by creating a cavity using a distributed Bragg reflector (DBR) configuration (e.g., Bragg mirrors on one or both ends of the active region) or simple mirrors at one or more edges of the cavity. Further alternately or additionally, ring resonators may be created by using a valve coupled to a bus waveguide, where the active gain medium may be either incorporated in the ring or located in the enclosed liquid. In all of the configurations, the active light source may be defined and activated by moving a lightvalve component (e.g., a waveguiding microvalve component) within, into, and/or out of an optical path.

In some embodiments, a physically operable optofluidic light-source is provided, the optofluidic light-source comprising: a substrate layer; and an active layer comprising: a channel configured to comprise a first fluid comprising a gain medium for a light source; and a flexible layer comprising a trap defining an active region of the light source and configured to confine a predetermined volume of the first fluid; wherein the flexible layer is configured to deform and to thereby move the trap between a first position and a second position, wherein: when the trap is in the first position, the light source is activated, and when the trap is in the second position, the light source is deactivated.

In some embodiments of the optofluidic light-source, the light source is a laser light source and wherein, when the trap is in the first position, the laser light source is activated.

In some embodiments of the optofluidic light-source: the trap comprises an opening on one side; the trap is configured to allow the first fluid to flow into and out of the opening of the trap when the trap is in the first position; and the trap is configured to form a seal against a wall of the channel when the trap is in the second position such that the first fluid may not flow into or out of the trap.

In some embodiments of the optofluidic light-source, the optofluidic light source further comprises a chamber configured to be pressurized or depressurized with a fluid to cause the flexible layer to deform.

In some embodiments of the optofluidic light-source, the first fluid has a refractive index of greater than or equal to 1.0, 1.05, 1.1, or 1.25 and less than or equal to 1.75, 1.9, 2.0, 2.1, or 2.25.

In some embodiments of the optofluidic light-source, the substrate layer has a refractive index of greater than or equal to 1.3, 1.4, or 1.5 and less than or equal 3.0, 3.25, 3.5, 3.75, or 4.

In some embodiments of the optofluidic light-source, the trap has a refractive index of greater than or equal to 1.2, 1.25, 1.3, 1.35, or 1.4 and less than or equal to 1.4, 1.45, 1.5, 1.55, or 1.6.

In some embodiments of the optofluidic light-source, the light source is configured to output light in a first direction parallel to a plane defined by the substrate layer.

In some embodiments of the optofluidic light-source, the optofluidic light-source further comprises an analyte channel configured to contain an analyte in a position such that the analyte is illuminated by the light source.

In some embodiments of the optofluidic light-source, light from the light source is directed to the analyte channel by one or more waveguides.

In some embodiments of the optofluidic light-source, the active region of the light source is configured to be pumped by illumination incident on the active region at an angle to the active layer.

In some embodiments of the optofluidic light-source, the active region of the light source is configured to be pumped by illumination incident on the active region from within the active layer.

In some embodiments of the optofluidic light-source, the optofluidic light source is configured to evacuate the first fluid in the channel and in the trap and to replace it with a second fluid having a different index of refraction, such that the light source generates output light at a first wavelength when using the first fluid and at a second wavelength when using the second fluid with a same pump source.

In some embodiments of the optofluidic light-source, the trap comprises one or more gratings configured to cause the light source to operate as a distributed feedback laser.

In some embodiments of the optofluidic light-source, the trap is configured to deform and to thereby adjust a period of the one or more gratings and to thereby adjust a wavelength of output laser light of the distributed feedback laser.

In some embodiments of the optofluidic light-source, the trap comprises one or more mirrors configured to define a cavity of the active region of the laser light source.

In some embodiments of the optofluidic light-source, the trap comprises one or more distributed Bragg reflectors configured to cause the laser light source to operate as a distributed Bragg reflector laser.

In some embodiments of the optofluidic light-source, wherein the trap comprises an annular shape configured to create a ring resonator.

In some embodiments of the optofluidic light-source, wherein the predetermined volume of the first fluid is greater than or equal to 100 fL, 1 pL, or 10 pL, 100 pL and less than or equal to 1 nL, 10 nL, or 100 nL.

In some embodiments of the optofluidic light-source, wherein a distance between the first position and the second position is greater than or equal to 0.1 μm, 1 μm, 10 μm, or 50 μm and less than or equal to 50 μm, 100 μm, 500 μm, or 1 mm.

In some embodiments of the optofluidic light-source, wherein the active layer is disposed on a chip comprising one or more of: one or more analyte channels, one or more pump light sources, one or more sample preparation components, or one or more detectors.

In some embodiments, a physically operable light-source is provided, the physically-operable light source comprising: a substrate layer; and an active layer comprising a solid-core optical component comprising a gain medium for a laser light source, wherein the solid-core optical component comprises the active region of the laser light source; wherein the active layer is flexible and is configured to deform from a first position to a second position, wherein: when the active layer is in the first position, the laser light source is activated, and when the active layer is in the second position, the laser light source is deactivated.

In some embodiments of the physically operable light-source, the active layer deforming between the first position and the second position causes the solid-core optical component to selectably move from a first component position at which the laser light source is activated to a second component position at which the laser light source is deactivated.

In some embodiments of the physically operable light-source, the active layer deforming between the first position and the second position causes the solid-core optical component to selectably deform from a state at which the laser light source is activated to a second state at which the laser light source is deactivated.

In some embodiments of the physically operable light-source, the physically operable light source further comprises a chamber configured to be pressurized or depressurized with a gas to cause the active layer to deform.

In some embodiments of the physically operable light-source, the solid-core optical component has a refractive index greater than or equal to 1.3, 1.35, 1.4, 1.45, or 1.5 and less than or equal to 1.6, 1.65, 1.7, 1.75, or 1.8.

In some embodiments of the physically operable light-source, the solid-core optical component has a refractive index greater than or equal to a refractive index of one or more adjacent layers.

In some embodiments of the physically operable light-source, the substrate layer has a refractive index that is less than a refractive index of the solid-core optical component.

In some embodiments of the physically operable light-source, the light source is configured to output light in a first direction parallel to a plane defined by the substrate layer.

In some embodiments of the physically operable light-source, the physically operable light source further comprises an analyte channel configured to contain an analyte in a position such that the analyte is illuminated by the light source.

In some embodiments of the physically operable light-source, light from the light source is directed to the analyte channel by one or more waveguides.

In some embodiments of the physically operable light-source, the active region of the light source is configured to be pumped by illumination incident on the active region at an angle to the active layer.

In some embodiments of the physically operable light-source, the active region of the light source is configured to be pumped by illumination incident on the active region from within the active layer.

In some embodiments of the physically operable light-source, the solid-core optical component comprises one or more gratings configured to cause the light source to operate as a distributed feedback laser.

In some embodiments of the physically operable light-source, the active layer is configured to deform to a third position in which the solid-core optical component deforms such that a period of the grating changes to thereby adjust a wavelength of output laser light of the distributed feedback laser.

In some embodiments of the physically operable light-source, the solid-core optical component comprises one or more mirrors configured to define a cavity of the active region of the light source.

In some embodiments of the physically operable light-source, the solid-core optical component comprises one or more distributed Bragg reflectors configured to cause the light source to operate as a distributed Bragg reflector laser.

In some embodiments of the physically operable light-source, the solid-core optical component comprises an annular shape configured to create a ring resonator.

In some embodiments of the physically operable light-source, a volume of the solid-core optical component is greater than or equal to 100 fL, 1 pL, or 10 pL, 100 pL and less than or equal to 1 nL, 10 nL, or 100 nL.

In some embodiments of the physically operable light-source, a distance between the first component position and the second component position is greater than or equal to 0.1 µm, 1 µm, 10 µm, or 50 µm and less than or equal to 50 µm, 100 µm, 500 µm, or 1 mm.

In some embodiments of the physically operable lightsource, the active layer is disposed on a chip comprising one or more of: one or more analyte channels, one or more pump light sources, one or more sample preparation components, or one or more detectors.

DETAILED DESCRIPTION OF ILLUSTRATIVE EMBODIMENTS

The combination of PDMS-based microvalves and waveguides may enable the creation of a host of novel and reconfigurable on-chip light sources. These light sources may be fully compatible with established planar particle sensing architecture using either single-mode or multi-mode interference (MMI) waveguides.

Figures 3A, 3B:
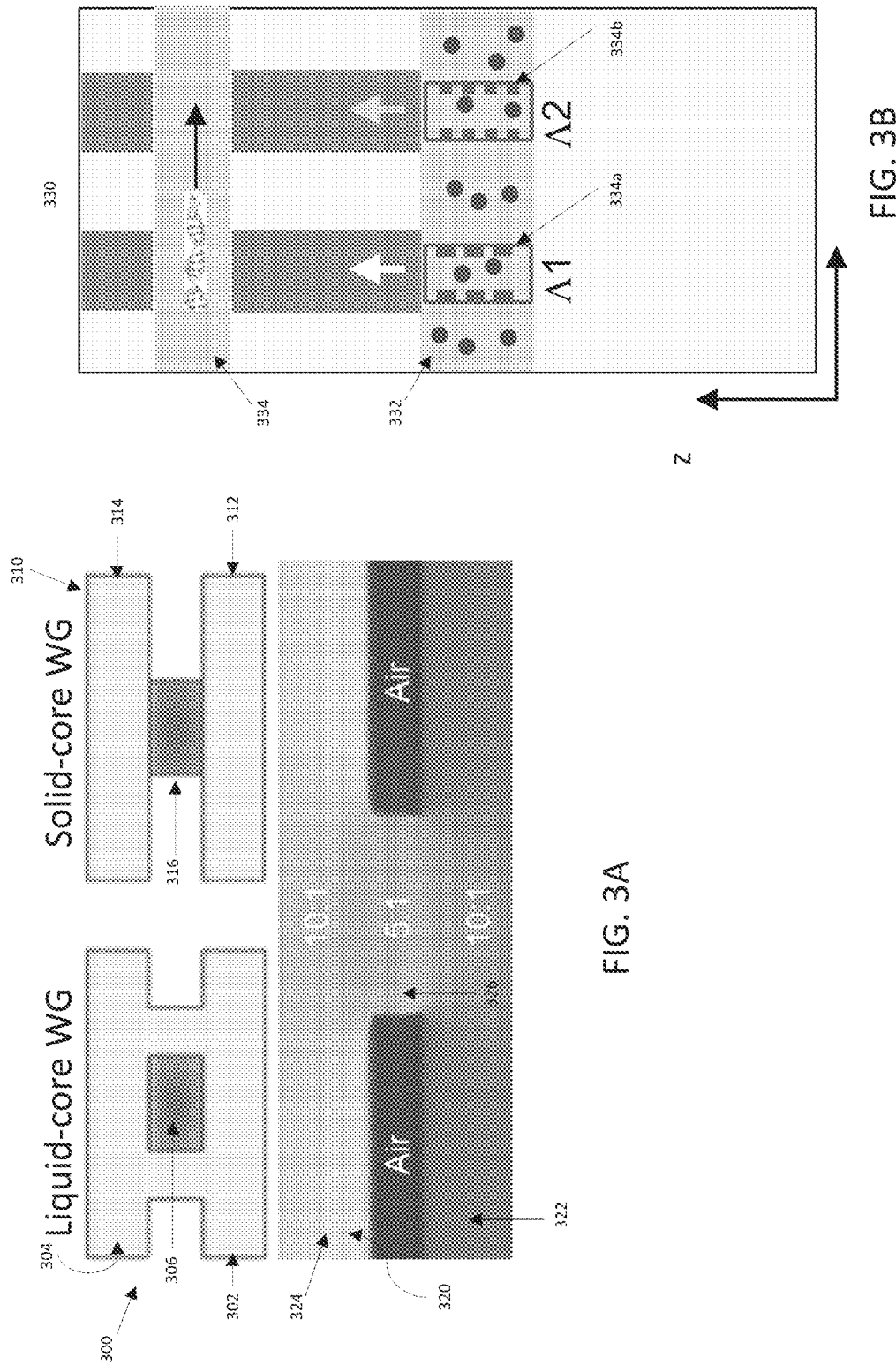
FIG. 3A is an illustration of cross-sectional views of PDMS-based solid-core and liquid-core waveguides for use in on-chip reconfigurable light sources, in accordance with some embodiments.
FIG. 3B is an illustration of an on-chip reconfigurable light source comprising liquid-core DFB lasers, in accordance with some embodiments.
Figure 3C:
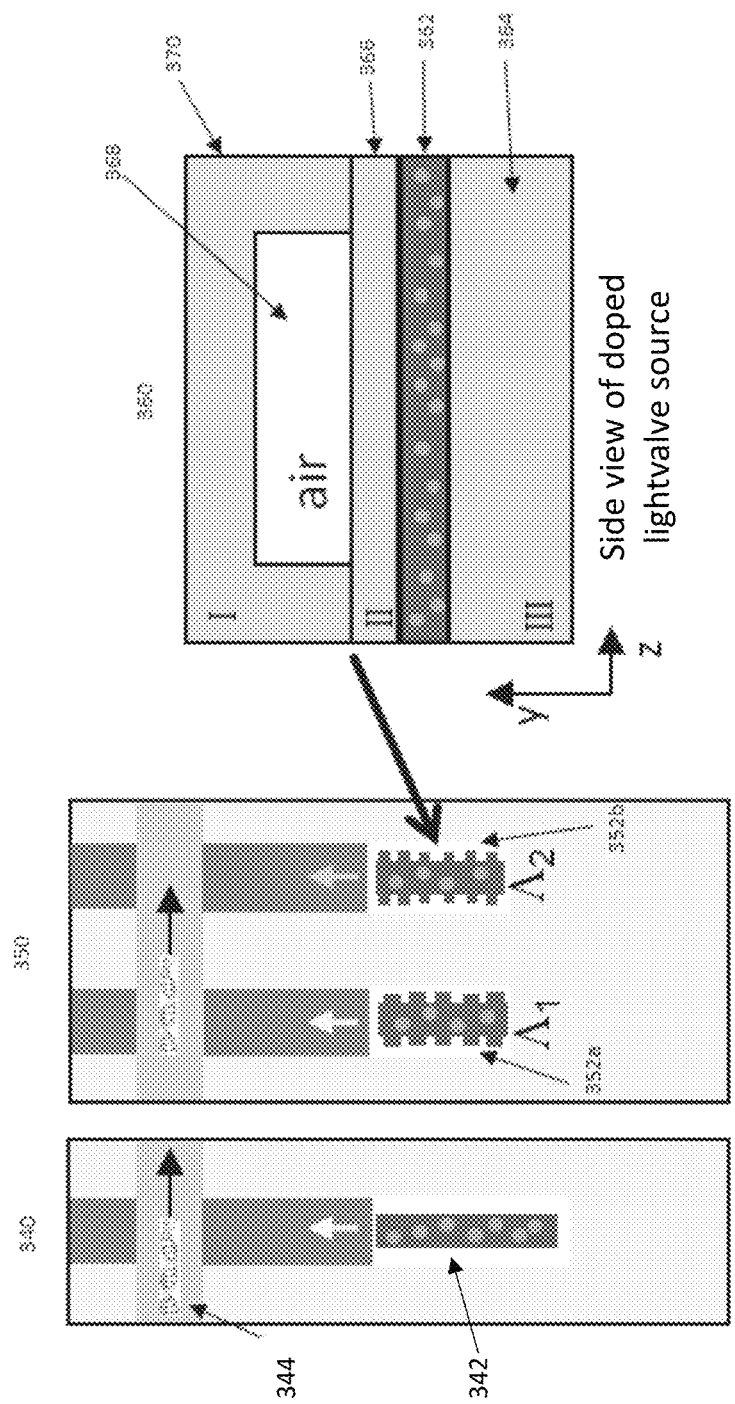
FIG. 3C is an illustration of various views of an on-chip reconfigurable light source comprising solid-core luminescence and DFB laser sources created by doping quantum dots in a high-index layer, in accordance with some embodiments.

Below, FIGS. 3A-3C depict various lightvalve-based on-chip reconfigurable light sources and solid-core and liquid-core PDMS-based waveguides for use therein. Liquid-core and/or solid-core waveguides may be used to form lightvalves and to design novel, actuable, reconfigurable on-chip light sources. Example configurations of waveguides are shown below in FIG. 3A, while example configurations of reconfigurable on-chip light sources are shown below in FIGS. 3B and 3C. Reconfigurable, lightvalve-based on-chip light sources, as discussed herein, may in some embodiments be tunable in one or more ways, and may in some embodiments comprise quantum dots as active media. Quantum dots may be beneficial as an active media in reconfigurable, lightvalve-based on-chip light sources due to their efficiency, stability, and ability to create different emission colors with a single pump source. In some embodiments, alternate or additional active media, such as organic dyes, may also be used.

FIG. 3A is an illustration of cross-sectional views of PDMS-based solid-core and liquid-core waveguides for use in lightvalve-based on-chip reconfigurable light sources, in accordance with some embodiments. The solid-core and liquid-core waveguides shown in FIG. 3A may be used as an optical element in guiding light in a lightvalve that may be integrated into an on-chip reconfigurable light source, such as an on-chip reconfigurable laser as shown in FIGS. 3B and 3C. (While the present disclosure discusses laser gain mediums and laser light sources, it should be noted that a laser structure may be operated as a light source below a lasing threshold. Therefore, the disclosures herein regarding laser light sources may also be applicable to non-laser light sources using laser structures below a lasing threshold, and/or to optically pumped incoherent light sources.)

FIG. 3A shows liquid-core waveguide 300, solid-core waveguide 310, and solid-core waveguide 320. As shown, liquid-core waveguide 300 may comprise bottom layer 302 and top layer 304, which may be PDMS layers having a first refractive index. Liquid-core waveguide 300 may comprise liquid core 306 in between layers 302 and 304; liquid core 306 may comprise a hollow channel configured to be able to be filled with a liquid having a second refractive index, which may in some embodiments be higher than the first refractive index. In some embodiments, one or both of layers 302 and 304 may be flexible, deformable, and/or movable, such that the dimensions of liquid-core 306 located between layers 302 and 304 may be altered.

As shown, solid-core waveguide 310 may comprise bottom layer 312 and top layer 314, which may be PDMS layers having a third refractive index. Solid-core waveguide 310 may comprise solid core 316 in between layers 312 and 314; solid core 316 may comprise a PDMS layer or other layer configured to transmit light, the layer having a fourth refractive index, which may in some embodiments be higher than the third refractive index. In some embodiments, one or both of layers 312 and 314 may be flexible, deformable, and/or movable, such that the position, dimensions, angle, strain, thickness, or one or more other properties of solid-core 316 located between layers 302 and 304 may be altered.

As shown, solid-core waveguide 320 may comprise bottom layer 322, top layer 324, and solid core 326. Solid-core waveguide 320 may share some or all characteristics in common with solid-core waveguide 310. As shown, solid core 326 may be made with a different mixing ratio of PDMS precursor liquids (5:1) than the ratio used for bottom layer 322 and top layer 324 (10:1), thereby yielding a different index of refraction for solid core 326 than for bottom layer 322 and top layer 324.

In some embodiments of solid-core waveguides, such as solid-core waveguide 310 and/or solid-core waveguide 320, lateral optical guiding may be ensured by surrounding the core with air channels (see air channels to the left and right of both solid core 316 and solid core 326), resulting in low propagation losses.

In some embodiments, a channel height and or channel width of liquid-core waveguide 300, solid-core waveguide 310, and/or solid-core waveguide 320 may be greater than or equal to 1 µm, 2.5 µm, 5 µm, 10 µm, 25 µm, 50 µm, 100 µm, 250 µm, or 500 µm. In some embodiments, a channel height and or channel width of liquid-core waveguide 300, solid-core waveguide 310, and/or solid-core waveguide 320 may be less than or equal to 1 µm, 2.5 µm, 5 µm, 10 µm, 25 µm, 50 µm, 100 µm, 250 µm, or 500 µm. In some embodiments, a channel height and or channel width of liquid-core waveguide 300, solid-core waveguide 310, and/or solid-core waveguide 320 may be between 5 and 100 µm.

In some embodiments, liquid-core waveguide 300 may have a fluid throughput greater than or equal to 1 fL/s, 10 fL/s, 25 fL/s, 100 fL/s, 1 pL/s, 10 pL/s, 100 pL/s, 1 nL/s, 10 nL/s, 100 nL/s, or 1 µL/s. In some embodiments, liquid-core waveguide 300 may have a fluid throughput less than or equal to 1 fL/s, 10 fL/s, 25 fL/s, 100 fL/s, 1 pL/s, 10 pL/s, 100 pL/s, 1 nL/s, 10 nL/s, 100 nL/s, or 1 µL/s. In some embodiments, liquid-core waveguide 300 may have a fluid throughput of between 25 fL/s and 10 nL/s.

In some embodiments, a refractive index of a lower layer (which may also be referred to as a substrate layer) of liquid-core waveguide 300, solid-core waveguide 310, and/or solid-core waveguide 320 may be greater than or equal to 1.2, 1.3, 1.4, 2.0, 3.0, 3.5, 3.6, or 3.7. In some embodiments, a refractive index of a lower layer (which may also be referred to as a substrate layer) of liquid-core waveguide 300, solid-core waveguide 310, and/or solid-core waveguide 320 may be less than or equal to 1.2, 1.3, 1.4, 2.0, 3.0, 3.5, 3.6, or 3.7. In some embodiments, a refractive index of a lower layer (which may also be referred to as a substrate layer) of liquid-core waveguide 300, solid-core waveguide 310, and/or solid-core waveguide 320 may be between 1.4 and 3.5. In some embodiments, a substrate may alternately or additionally comprise a high-index medium such as silicon with anti-resonant reflecting optical waveguide (AR-ROW) layers on top.

In some embodiments, a refractive index of solid core 316 (and/or of any other solid-core optical component discussed herein) may be greater than or equal to 1.2, 1.3, 1.4, 1.5, 1.6, 1.7, 1.8, or 1.9. In some embodiments, a refractive index of solid core 316 (and/or of any other solid-core optical component discussed herein) may be less than or equal to 1.2, 1.3, 1.4, 1.5, 1.6, 1.7, 1.8, or 1.9. In some embodiments, a refractive index of solid core 316 (and/or of any other solid-core optical component discussed herein) may be between 1.4 and 1.7.

In some embodiments, a refractive index of a fluid in liquid-core waveguide 300 may be greater than or equal to 1.0, 1.25, 1.5, 1.75, 2.0, 2.25, or 2.5. In some embodiments, a refractive index of a fluid in liquid-core waveguide 300 may be less than or equal to 1.1, 1.25, 1.5, 1.75, 2.0, 2.25, or 2.5. In some embodiments, a refractive index of a fluid in liquid-core waveguide 300 may be between 1.0 and 2.0.

In some embodiments, one or more layers and/or optical components of liquid-core waveguide 300, solid-core waveguide 310, and/or solid-core waveguide 320 may be operably selectively displaceable by a distance greater than or equal to 1 nm, 0.1 µm, 1 µm, 10 µm, 50 µm, 100 µm, 500 µm, or 1 mm. In some embodiments, one or more layers and/or optical components of liquid-core waveguide 300, solid-core waveguide 310, and/or solid-core waveguide 320 may be operably selectively displaceable by a distance less than or equal to 1 nm, 0.1 µm, 1 µm, 10 µm, 50 µm, 100 µm, 500 µm, or 1 mm. In some embodiments, one or more layers and/or optical components of liquid-core waveguide 300, solid-core waveguide 310, and/or solid-core waveguide 320 may be operably selectively displaceable by a distance between 0.1 µm and 100 µm.

In some embodiments, the dimensions, displaceability, refractive indexes, and other characteristics of liquid-core waveguide 300, solid-core waveguide 310, and/or solid-core waveguide 320 may be shared by one or more liquid-core or solid-core components of any of the other waveguides, light-valves, optical traps, and other systems and/or components discussed herein.

FIG. 3B is an illustration of lightvalve-based on-chip reconfigurable light source 330 comprising liquid-core DFB lasers, in accordance with some embodiments. As shown in FIG. 3B, a DFB laser source with lateral gratings may be created by lightvalve optical elements that may be raised out of and lowered into a liquid-filled channel, wherein the liquid may serve as the gain medium for the DFB laser.

As shown, light source 330 may comprise channel 332, which may be filled with a liquid solution (e.g., solution or suspension) containing quantum dots, dye molecules, and/or other particles with optical transitions that may act as a gain medium for DFB lasers. Channel 332 may be configured such that fluid traps 334a and 334b may each be lowered into and raised out of channel 332 in a similar manner to valve seat 202 described above. Fluid traps 334a and 334b may be configured such that lowering them into a liquid in channel 332 may trap a predefined volume of the liquid in channel 332 inside each of the traps. In some embodiments, a volume of one or more of traps 334a and 334b may be less than or equal to 100 fL, 1 pL, 10 pL, 100 pL, 1 nL, 10 nL, or 100 nL. In some embodiments, a volume of one or more of traps 334a and 334b may be greater than or equal to 100 fL, 1 pL, 10 pL, 100 pL, 1 nL, 10 nL, or 100 nL. In some embodiments, a volume of one or more of traps 334a and 334b may be between 1 pL and 10 nL.

Unlike valve seat 202 described above, fluid traps 334a and 334b may comprise gratings on one or more sides of each of the traps. Thus, traps 334a and 334b, including the gratings defined by one or more of the portions of the traps, may each define an active region of a DFB laser when the traps are illuminated. As shown in FIG. 3B, trap 334a may comprise a grating of a first grating period ($\Lambda 1$) while trap 334b may comprise a grating of a second grating period ($\Lambda 2$) different from the first grating period; accordingly, trap 334a may define the active region of a first DFB laser that lases at a first emission wavelength, while trap 334b may define the active region of a second laser that lases at a second emission wavelength different from the first emission wavelength. Because traps 334a and 334b may be raised out of and lowered into channel 332, light source 330 may be activated when one or more of the traps is lowered into channel 332 and may be deactivated when the traps are raised out of channel 332.

As shown in FIG. 3B, light source 330 may further comprise analyte channel 334, which may be disposed on (e.g., on-chip) or in relation to light source 330 such that the laser light generated by one or both DFB lasers may be directed toward and onto analytes (e.g., DNA particles, as shown) in analyte channel 334. In some embodiments, laser light of the DFB lasers may be guided by one or more waveguides toward analyte channel 334. While the example of FIG. 3 shows multiple lasers with output light incident on the same analyte channel 334, in some embodiments different lasers in the same light source may direct laser light to be incident on two or more different analyte channels.

While, the example of light source 330 shows two DFB lasers created by the active regions defined by traps 334a and 334b, respectively, other on-chip light sources could be fabricated to comprise only a single laser, or to comprise three or more lasers. In a similar manner as shown by traps 334a and 334b, additional lasers could be created by optical elements defining active laser regions that are configured to be raised in and out a channel filled with a liquid serving as a gain medium, such as the same channel 332 in which traps 334a and 334b are located. In some embodiments, different channels (e.g., separate channels having different liquid gain mediums having different optical properties) could be implemented on the same chip.

In some embodiments, light source 330 may be tunable by choosing different quantum dots, dye molecules, and/or other particles used as optical gain medium to be included in the liquid in channel 332 (note that a solution may be evacuated after use and replaced with a different solution containing different quantum dots, dye molecules, and/or other particles used as optical gain medium), the activation of different valves, and/or by mechanically changing a grating period of a trap (e.g., traps 334a and/or 334b) by exerting pneumatic pressure on the trap and/or one or more walls defining the channel in which the trap is located.

FIG. 3C is an illustration of various views of a lightvalve-based on-chip reconfigurable light source comprising solid-core luminescence and DFB laser sources created by doping quantum dots in a high-index layer, in accordance with some embodiments. In some embodiments, quantum dots may be incorporated directly into a solid-core component of a lightvalve-based light-source. Namely, FIG. 3C shows an overhead view of light-source 340, an overhead view of light-source 350, and a partial side cross-sectional view of light-source 360.

Light source 340 may comprise a single solid-core optical component 342 defined by a solid PMDS element comprising a plurality of quantum dots and configured to generate output light to be directed onto analyte channel 344. In some embodiments, light source 340 does not produce optical feedback for lasing. Rather, light source 340 is, in some embodiments, an optically pumped incoherent light source whose emission wavelength may be determined by the particles contained in solid-core optical component 342.

Light source 350 may comprise two separate active regions 352a and 352b, each defined by a respective solid PMDS element comprising a respective plurality of quantum dots and respective gratings. In some embodiments, region 352a may comprise a grating of a first grating period ($\Lambda_1$) while region 352a may comprise a grating of a second grating period ($\Lambda_2$) different from the first grating period; accordingly, region 352a may define the active region of a first DFB laser that lases at a first emission wavelength, while region 352b may define the active region of a second laser that lases at a second emission wavelength different from the first emission wavelength. In some embodiments, one or both of the DFB lasers may be able to be activated and/or deactivated by mechanically actuating region 352a and/or 352b to move it into and/or out of an optical path of pumping light; in some embodiments, one or both of the DFB lasers may able to be activated, deactivated, and/or tuned by mechanically deforming (e.g., compressing) region 352a and/or 352b to adjust $\Lambda_1$ and/or $\Lambda_2$, causing lasing of the lasers to begin, cease, and/or tune/adjust lasing wavelength.

Light source 360, shown in a partial side cross-sectional view, may in some embodiments be a same or similar light source as one or more of light source 340 and 350. Partial side cross-sectional view of light-source 360 shows where, in some embodiments, the emitting medium in layer 362 may be located, in that it may be disposed between lower layer 364 and upper layer 366. In some embodiments, quantum dots may be added to PDMS precursors when layer 364 is mixed. In some embodiments, upper layer 366 may be configured to be flexible, and may be located underneath air pocket 368, which may be enclosed by layer 370. Air pocket 368 may thus be pressurized and/or depressurized to exert force on upper layer 366 to cause deformation of the solid emitting medium that may enable cause light source 360 to turn on/off and/or cause adjustment of an emission wavelength of light source 360, in a same or similar manner as discussed above with respect to deforming regions 352a and/or 352b.

Figure 1A:
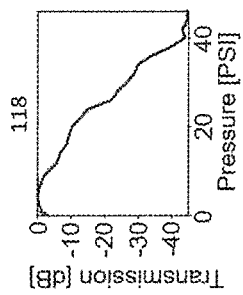
FIG. 1A is an illustration of an optofluidic reconfigurable waveguide in a closed position, in accordance with some embodiments.
Figure 1B:
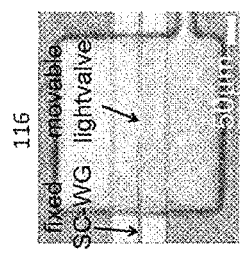
FIG. 1B is an illustration of an optofluidic reconfigurable waveguide in an open position, in accordance with some embodiments.
Figure 1C:
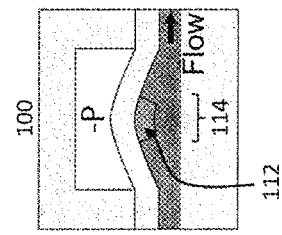
FIG. 1C is a photograph of an optofluidic reconfigurable waveguide optically interfaced with two fixed solid-core waveguides.
Figure 1D:
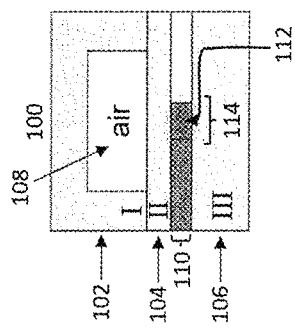
FIG. 1D depicts a graph of measured pressure-dependent transmission of an optofluidic reconfigurable waveguide, in accordance with some embodiments.

While certain example embodiments disclosed herein show a flexible upper layer that is formed separately from a trap and/or from a solid-core optical component (e.g., light-source 360 in FIG. 3C; waveguide 100 in FIGS. 1A and 1B), it should be noted that, in some embodiments, a fluid trap and/or solid-core optical component of any one or more of the waveguides and/or light sources disclosed herein may be comprised in a flexible layer (e.g., an upper layer) itself. That is, a fluid trap and/or solid-core optical component of any one or more of the waveguides and/or light sources disclosed herein may be formed integrally as a part of a flexible layer, may be disposed in a same plane as a flexible layer, and/or may be disposed as a completely or partially protruding portion of a flexible layer. That is, traps and solid-core optical components shown herein may, in some embodiments, be separate components or separate layers from flexible/deformable layers; while, in some embodiments, they may instead be an integral part of flexible/deformable layers.

In some embodiments, using established fabrication methods, other solid-core waveguides may be built on the chip substrate of light sources 340, 350, and/or 360, and will not have any embedded dots, allowing for (1) locally incorporating emitters on the chip, and (2) activating those sources by mechanically deforming one or more elements of the light source, such as by lowering an optical component of a lightvalve into its closed position.

Figures 2A, 2B, 2C:
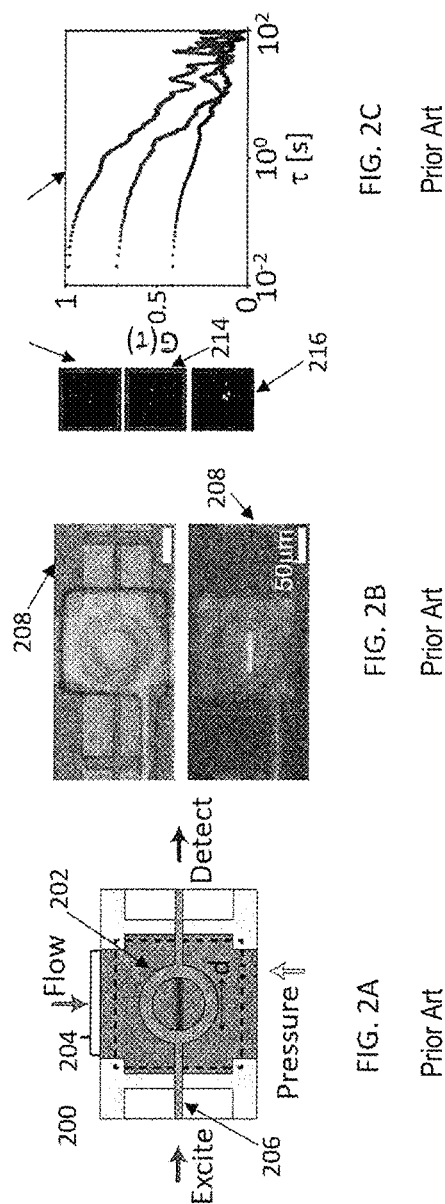
FIG. 2A is an illustration of an optofluidic reconfigurable waveguide fluid trap, in accordance with some embodiments.
FIG. 2B depicts two photographs (one at top, and one at bottom) of an optofluidic reconfigurable waveguide fluid trap, in accordance with some embodiments.
FIG. 2C depicts three photographs of fluorescent beads trapped in an optofluidic fluid trap (at left) and a graph of three autocorrelation traces (at right) created by exciting the trapped particles corresponding to the photographs, in accordance with some embodiments.

As shown, an optically active straight lightvalve (i.e. a quantum-dot-doped version of the valve in FIGS. 2A and/or 2B) may be designed as an incoherent source; furthermore, lightvalves shaped with lateral Bragg gratings to create DFB lasers that can be mechanically activated may be designed. In some embodiments, these sources may be solid-state sources without the need for liquids, such that the light sources may operate in air. These sources may be tunable by mechanical actuation and compression of the valve.

While certain embodiments discussed above have contemplated using DFB gratings in lightvalve-based reconfigurable light sources, the feedback for creating a laser source may comprise one or more alternate or additional components and/or configurations in the active region, such as a DBR configuration (e.g., Bragg mirrors on one or both ends of the active region) or simple mirrors at one or more ends of the cavity. In some embodiments, alternately or additionally, ring resonators may be created by using a configuration such as the one shown in FIG. 2A coupled to a bus waveguide, where the active gain medium may be either incorporated in the ring or located in the enclosed liquid. In all of the configurations, the active light source may be defined and activated by moving and/or deforming a lightvalve component (e.g., a waveguiding microvalve component).

In some embodiments, any of the light sources discussed herein may be optically pumped by illumination from the top, from the bottom, or in-plane by one or more connected waveguides.

In some embodiments, all or part of any of the light sources discussed herein may be formed as or disposed on a chip comprising one or more analyte channels, one or more pump light sources, one or more sample preparation components, and/or one or more detectors. In some embodiments, sample preparation components may comprise one or more components for fluorescent labeling, target extractions, filtering of analyte fluid (e.g., to remove pieces too large for an analyte channel), sample flow control (e.g., by one or more microvalve-based components) or other sample preparation processes. In some embodiments, any one or more of these components may be disposed on a same substrate (e.g., chip) as one or more of the other components discussed herein.

It should be noted that this disclosure has discussed several embodiments having "liquid" components and/or "liquid-core" components. However, in some embodiments, fluids and fluid-core components (e.g., liquids and/or gases and liquid-core components and/or gas-core components) may be used. That is, gases and/or gas-core components may be used alternately or in addition to liquids and liquid-core components. In some embodiments, fluids and fluid-core components for use in any one or more of the embodiments discussed herein may share any one or more characteristics in common with the liquids and liquid-core components discussed herein, respectively.

What is claimed is:

1. A physically operable optofluidic light-source, comprising:
   a substrate layer; and
   an active layer comprising:
      a channel configured to comprise a first fluid comprising a gain medium for a light source; and
      a flexible layer comprising a trap defining an active region of the light source and configured to confine a predetermined volume of the first fluid;
   wherein the flexible layer is configured to deform and to thereby move the trap between a first position and a second position, wherein:
      when the trap is in the first position, in which the trap is configured to form a seal against a wall of the channel such that the first fluid may not flow into or out of the trap, the light source is activated, and
      when the trap is in the second position, in which the trap is configured to allow the first fluid to flow into and out of an opening on one side of the trap, the light source is deactivated.

2. The optofluidic light-source of claim 1, wherein the light source is a laser light source and wherein, when the trap is in the first position, the laser light source is activated.

3. The optofluidic light-source of claim 2, wherein the trap comprises one or more mirrors configured to define a cavity of the active region of the laser light source.

4. The optofluidic light-source of claim 2, wherein the trap comprises one or more distributed Bragg reflectors configured to cause the laser light source to operate as a distributed Bragg reflector laser.

5. The optofluidic light-source of claim 1, comprising a chamber configured to be pressurized or depressurized with a fluid to cause the flexible layer to deform.

6. The optofluidic light-source of claim 1, wherein the first fluid has a refractive index of greater than or equal to 1.0 and less than or equal to 2.25.

7. The optofluidic light-source of claim 1, wherein the substrate layer has a refractive index of greater than or equal to 1.3 and less than or equal 4.

8. The optofluidic light-source of claim 1, wherein the trap has a refractive index of greater than or equal to 1.2 and less than or equal to 1.6.

9. The optofluidic light-source of claim 1, wherein the light source is configured to output light in a first direction parallel to a plane defined by the substrate layer.

10. The optofluidic light-source of claim 1, comprising an analyte channel configured to contain an analyte in a position such that the analyte is illuminated by the light source.

11. The optofluidic light-source of claim 10, wherein light from the light source is directed to the analyte channel by one or more waveguides.

12. The optofluidic light-source of claim 1, wherein the active region of the light source is configured to be pumped by illumination incident on the active region at an angle to the active layer.

13. The optofluidic light-source of claim 1, wherein the active region of the light source is configured to be pumped by illumination incident on the active region from within the active layer.

14. The optofluidic light source of claim 1, wherein the optofluidic light source is configured to evacuate the first fluid in the channel and in the trap and to replace it with a second fluid having a different index of refraction, such that the light source generates output light at a first wavelength when using the first fluid and at a second wavelength when using the second fluid with a same pump source.

15. The optofluidic light-source of claim 1, wherein the trap comprises one or more gratings configured to cause the light source to operate as a distributed feedback laser.

16. The optofluidic light-source of claim 15, wherein the trap is configured to deform and to thereby adjust a period of the one or more gratings and to thereby adjust a wavelength of output laser light of the distributed feedback laser.

17. The optofluidic light-source of claim 1, wherein the trap comprises an annular shape configured to create a ring resonator.

18. The optofluidic light-source of claim 1, wherein the predetermined volume of the first fluid is greater than or equal to 100 fL and less than or equal to 10 nL.

19. The optofluidic light-source of claim 1, wherein a distance between the first position and the second position is greater than or equal to 0.1 μm and less than or equal to 1 mm.

20. The optofluidic light-source of claim 1, wherein the active layer is disposed on a chip comprising one or more of: one or more analyte channels, one or more pump light sources, one or more sample preparation components, or one or more detectors.

21. A physically operable light-source, comprising:
   a substrate layer;
   an active layer that is flexible and configured to deform comprising a solid-core optical component comprising a gain medium for a laser light source, wherein the solid-core optical component comprises an active region of the laser light source; and
   a chamber formed from an upper layer of the laser light source, the chamber configured to be pressurized or depressurized with a gas to cause the active layer to deform;
   wherein the active layer is configured to deform from a first position to a second position, wherein:
      when the active layer is in the first position, the laser light source is activated, and
      when the active layer is in the second position, the laser light source is deactivated.

22. The physically operable light-source of claim 21, wherein the active layer deforming between the first position and the second position causes the solid-core optical component to selectably move from a first component position at which the laser light source is activated to a second component position at which the laser light source is deactivated.

23. The physically operable light-source of claim 22, wherein the active layer deforming between the first position and the second position causes the solid-core optical component to selectably deform from a state at which the laser light source is activated to a second state at which the laser light source is deactivated.

24. The physically operable light-source of claim 23, wherein a distance between the first component position and the second component position is greater than or equal to 0.1 µm and less than or equal to 1 mm.

25. The physically operable light-source of claim 21, wherein the solid-core optical component has a refractive index greater than or equal to 1.3 and less than or equal to 1.8.

26. The physically operable light-source of claim 21, wherein the solid-core optical component has a refractive index greater than or equal to a refractive index of one or more adjacent layers.

27. The physically operable light-source of claim 21, wherein the substrate layer has a refractive index that is less than a refractive index of the solid-core optical component.

28. The physically operable light-source of claim 21, wherein the light source is configured to output light in a first direction parallel to a plane defined by the substrate layer.

29. The physically operable light-source of claim 21, comprising an analyte channel configured to contain an analyte in a position such that the analyte is illuminated by the light source.

30. The physically operable light-source of claim 29, wherein light from the light source is directed to the analyte channel by one or more waveguides.

31. The physically operable light-source of claim 21, wherein the active region of the light source is configured to be pumped by illumination incident on the active region at an angle to the active layer.

32. The physically operable light-source of claim 21, wherein the active region of the light source is configured to be pumped by illumination incident on the active region from within the active layer.

33. The physically operable light-source of claim 21, wherein the solid-core optical component comprises one or more gratings configured to cause the light source to operate as a distributed feedback laser.

34. The physically operable light-source of claim 33, wherein the active layer is configured to deform to a third position in which the solid-core optical component deforms such that a period of the grating changes to thereby adjust a wavelength of output laser light of the distributed feedback laser.

35. The physically operable light-source of claim 21, wherein the solid-core optical component comprises one or more mirrors configured to define a cavity of the active region of the light source.

36. The physically operable light-source of claim 21, wherein the solid-core optical component comprises one or more distributed Bragg reflectors configured to cause the light source to operate as a distributed Bragg reflector laser.

37. The physically operable light-source of claim 21, wherein the solid-core optical component comprises an annular shape configured to create a ring resonator.

38. The physically operable light-source of claim 21, wherein a volume of the solid-core optical component is greater than or equal to 100 fL and less than or equal to 100 nL.

39. The physically operable light-source of claim 21, wherein the active layer is disposed on a chip comprising one or more of: one or more analyte channels, one or more pump light sources, one or more sample preparation components, or one or more detectors.

* * * * *